(12) United States Patent
Togashi

(10) Patent No.: US 7,619,168 B2
(45) Date of Patent: Nov. 17, 2009

(54) FLEXIBLE SUBSTRATE, MOUNTED STRUCTURE, DISPLAY UNIT, AND PORTABLE ELECTRONIC APPARATUS

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 619 days.

(21) Appl. No.: 11/503,917

(22) Filed: Aug. 15, 2006

(65) Prior Publication Data

US 2008/0218984 A1    Sep. 11, 2008

(30) Foreign Application Priority Data

Aug. 18, 2005    (JP)    ............................ P2005-237540

(51) Int. Cl.
*H05K 1/16*    (2006.01)

(52) U.S. Cl. .................. 174/260; 174/254; 361/749

(58) Field of Classification Search ................. 174/260, 174/254; 361/749–751
See application file for complete search history.

(56) References Cited

U.S. PATENT DOCUMENTS

| | | | |
|---|---|---|---|
| 6,498,307 B2 | 12/2002 | Ichihara et al. | |
| 6,624,867 B2 * | 9/2003 | Hashimoto et al. | ........... 349/149 |
| 6,775,906 B1 * | 8/2004 | Silverbrook | .................. 29/846 |

FOREIGN PATENT DOCUMENTS

| | | |
|---|---|---|
| EP | 1 542 066 A1 | 6/2005 |
| GB | 2 394 365 A | 4/2004 |
| JP | 55-141974 U | 3/1979 |
| JP | A-05-205553 | 8/1993 |
| JP | U-05-095074 | 12/1993 |
| JP | A-09-181403 | 7/1997 |
| JP | A-11-097805 | 4/1999 |
| JP | A-11-260957 | 9/1999 |
| JP | A-2000-082868 | 3/2000 |
| JP | A-2000-124978 | 4/2000 |
| JP | A-2000-156579 | 6/2000 |
| JP | A-2000-277883 | 10/2000 |
| JP | A-2002-223082 | 8/2002 |
| JP | A-2003-152286 | 5/2003 |
| JP | A 2004-20703 | 1/2004 |
| JP | A-2004-095872 | 3/2004 |
| JP | A-2004-134430 | 4/2004 |

OTHER PUBLICATIONS

Office Action issued on Mar. 27, 2009 in counterpart Chinese Application No. 200610115942X.

* cited by examiner

*Primary Examiner*—Jeremy C Norris
(74) *Attorney, Agent, or Firm*—Oliff & Berridge, PLC

(57) ABSTRACT

It is an object to provide a flexible substrate according to which noise due to layered components can be reduced effectively without depending on changing layered components and the mounting positions thereof. To attain this object, a flexible substrate, which is a flexible substrate for mounting a capacitor, has flexibility, and has thereon a mounting region for mounting the capacitor, and a vibration transmission suppressing region in which holes are formed so as to surround the mounting region.

7 Claims, 7 Drawing Sheets

FLEXIBLE SUBSTRATE, MOUNTED STRUCTURE, DISPLAY UNIT, AND PORTABLE ELECTRONIC APPARATUS

BACKGROUND OF THE INVENTION

1. Field of the Invention

The present invention relates to a flexible substrate, a mounted structure obtained by mounting a layered component on the flexible substrate, and a display unit and a portable electronic apparatus having the flexible substrate herein.

2. Description of the Related Art

There are flexible substrates that are electrically connected to a display panel such as a liquid crystal display panel and have predetermined electronic components mounted thereon (see, for example, Japanese Patent Application Laid-open No. 2004-20703).

SUMMARY OF THE INVENTION

With an information apparatus or the like in which such a flexible substrate or liquid crystal display panel is used, noise may be produced when the power supply is turned on. To reduce such noise, it is necessary to identify the source of the noise and take countermeasures. Possible sources of the noise are, for example, a cooling fan and a hard disk, which may be noisy when operating. Moreover, an electronic component mounted on the flexible substrate may be a noise source. For example, if layered components are used as electronic components, then the layered components deform in the direction of an electric field, and hence if the voltage fluctuates, strain in the layered components may be produced periodically. It is thought that this periodic stain may be a cause of noise, and hence countermeasures taken to reduce noise are improving the layered components themselves, and changing the mounting positions of the layered components on the flexible substrate.

However, in the case that changes are made to the layered components as a noise countermeasure, there may be effects on the properties of the layered components, and hence this cannot always be done. Moreover, in the case that the mounting positions of the layered components on the flexible substrate are changed as a noise countermeasure, because the circuit elements vary according to the circuit configuration and so on, this is not always effective.

It is thus an object of the present invention to provide a flexible substrate, a mounted structure, a display unit, and a portable electronic apparatus, according to which noise due to layered components can be reduced effectively without depending on changing the mounting positions of the layered components.

To attain the above object, a flexible substrate according to the present invention is a flexible substrate for mounting a layered component, wherein the flexible substrate has flexibility, and has thereon a mounting region for mounting the layered component, and a vibration transmission suppressing region formed so as to surround the mounting region.

According to the present invention, because the vibration transmission suppressing region is formed so as to surround the mounting region in which the layered component is mounted, propagation of vibration caused by the layered component to other regions can be suppressed effectively.

Moreover, in the flexible substrate according to the present invention, it is preferable for the vibration transmission suppressing region to be formed from holes or cuts. Due to the holes or cuts, parts of the flexible substrate come to be in a discontinuous state, and hence propagation of vibration caused by the layered component to other regions can be suppressed more effectively.

Moreover, in the flexible substrate according to the present invention, it is preferable for the vibration transmission suppressing region to be formed from recesses. Through the recesses, parts of the flexible substrate become thinner, and hence propagation of vibration caused by the layered component to other regions can be suppressed more effectively.

A mounted structure according to the present invention is a mounted structure obtained by mounting a layered component on a flexible substrate for mounting the layered component, wherein the flexible substrate has flexibility, and has thereon a mounting region for mounting the layered component, and a vibration transmission suppressing region formed so as to surround the mounting region, and the layered component is mounted in the mounting region.

According to the present invention, because the vibration transmission suppressing region is formed so as to surround the mounting region in which the layered component is mounted, propagation of vibration caused by the layered component to other regions can be suppressed effectively.

Moreover, in the mounted structure according to the present invention, it is preferable for a plurality of the layered components to be mounted close to one another in a group, the vibration transmission suppressing region being formed so as to surround the group of the layered components. Because the vibration transmission suppressing region is formed surrounding a group of a plurality of the layered components, the spatial efficiency can be improved compared with the case that a vibration transmission suppressing region is formed for each individual layered component.

A display unit according to the present invention is a display unit comprising a display panel and a flexible substrate electrically connected to the display panel, wherein the flexible substrate has flexibility and is a substrate for mounting a layered component, and the flexible substrate has thereon a mounting region for mounting the layered component, and a vibration transmission suppressing region formed so as to surround the mounting region.

A portable electronic apparatus according to the present invention is a portable electronic apparatus having a display unit comprising a display panel and a flexible substrate electrically connected to the display panel, wherein the flexible substrate has flexibility and is a substrate for mounting a layered component, and the flexible substrate has thereon a mounting region for mounting the layered component, and a vibration transmission suppressing region formed so as to surround the mounting region.

According to the present invention, because the vibration transmission suppressing region is formed so as to surround the mounting region in which the layered component is mounted, propagation of vibration caused by the layered component to other regions can be suppressed effectively.

According to the present invention described above, a vibration transmission suppressing region is formed so as to surround a mounting region in which a layered component is mounted, whereby propagation of vibration caused by the layered component to other regions can be suppressed effectively. Noise due to the layered component can thus be reduced effectively without depending on changing the mounting position of the layered component.

DESCRIPTION OF THE PREFERRED EMBODIMENTS

Figure 1:
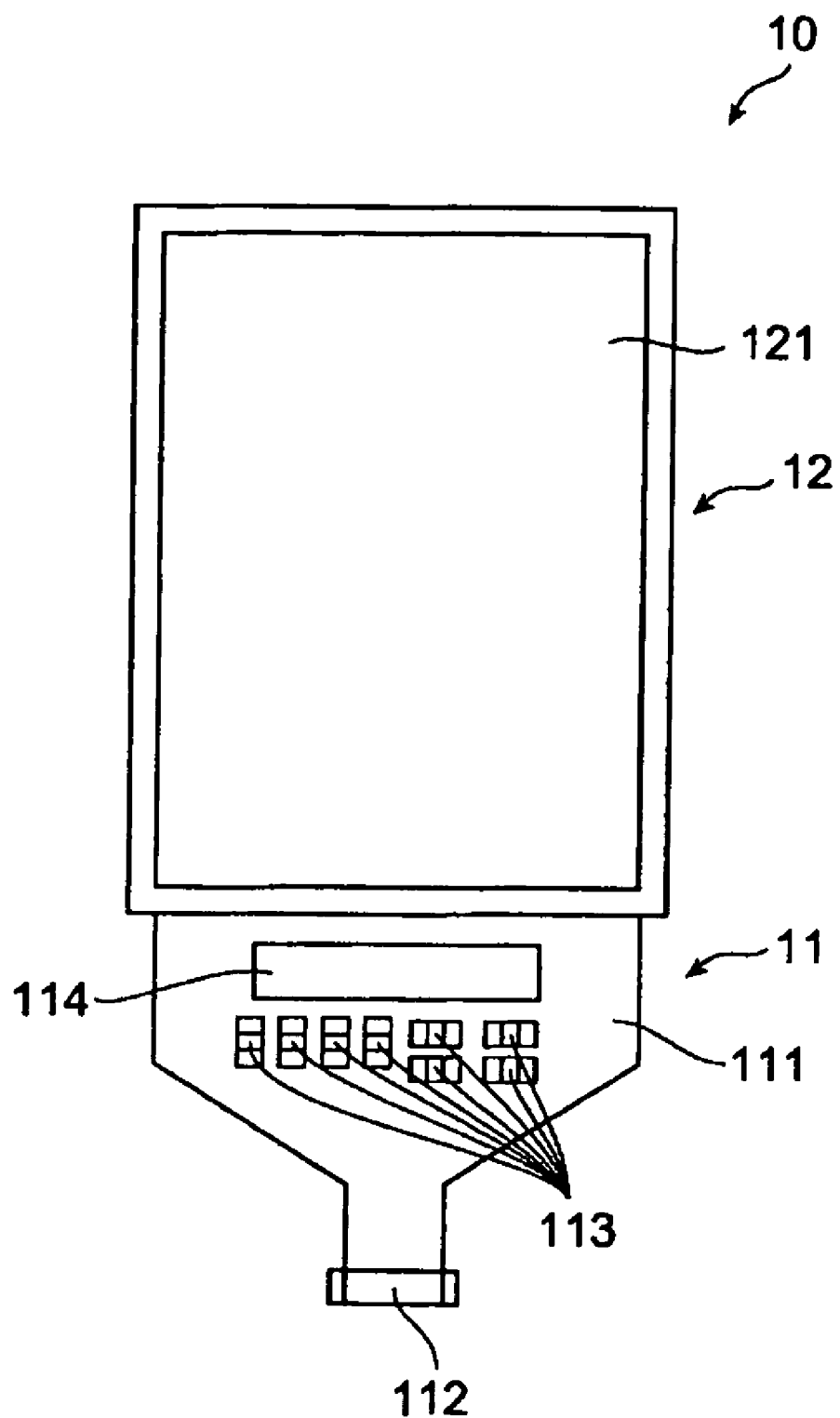
FIG. 1 is a schematic plane view showing the construction of a display unit according to an embodiment of the present invention.

The findings of the present invention can be easily understood through the following detailed description with reference to the appended drawings, which are shown merely for illustration. Next, embodiments of the present invention will be described with reference to the appended drawings. When possible, parts that are the same as one another are designated by the same reference numeral, and repeated description is omitted.

A display unit according to an embodiment of the present invention will be described with reference to FIG. 1. FIG. 1 is a schematic plane view for showing the construction of the display unit 10. The display unit 10 comprises a circuitry portion 11 and a display portion 12.

In the circuitry portion 11, capacitors 113 (layered components) and a driver IC 114 are mounted on a flexible substrate 111 having flexibility. The driver IC 114 is a driver for driving a display panel 121 of the display portion 12.

The capacitors 113 are layered electronic components, and are arranged for bias (charge pump, DC/DC converter) for driving the display panel 121. The capacitors 113 are minute layered components of size 1608 or size 1005.

On the opposite side of the flexible substrate 111 to a portion connected to the display panel 121 is provided a connector 112, which is constructed such as to enable connection to other circuitry portions.

The display portion 12 has the display panel 121, which is a liquid crystal display panel. The display panel 121 is driven by the circuitry portion 11, which controls the display contents of the display panel 121.

Figure 2:
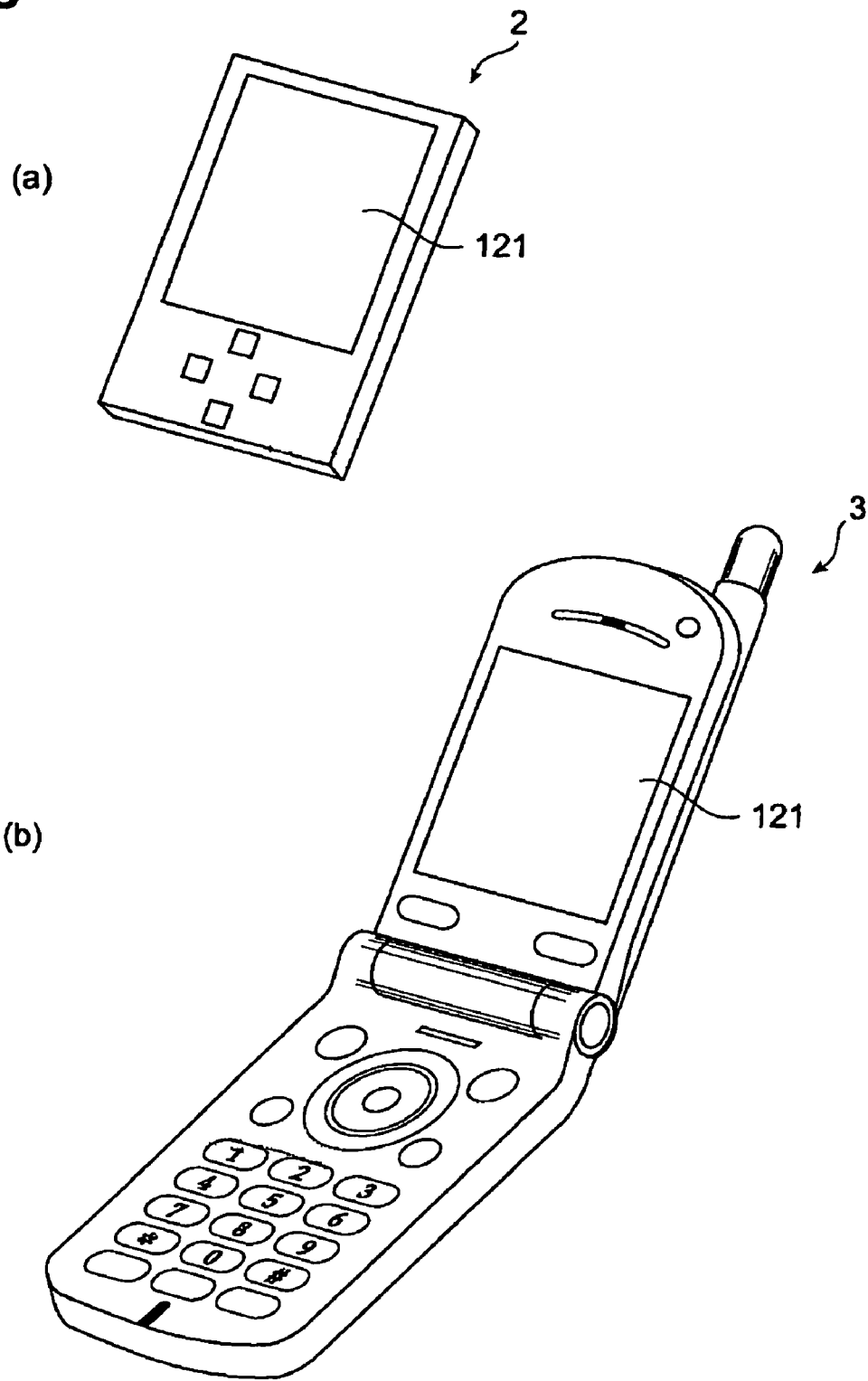
FIG. 2 are drawings showing examples of portable electronic apparatuses in which the display unit of FIG. 1 can be used.

The display unit 10 has the display panel 121 and the flexible substrate 111 that is electrically connected to the display panel 121 in this way, and is used in a portable electronic apparatus. Examples of the portable electronic apparatus are a music player 2 (portable electronic apparatus) as shown in FIG. 2A and a mobile phone 3 (portable electronic apparatus) as shown in FIG. 2B.

Figure 3:
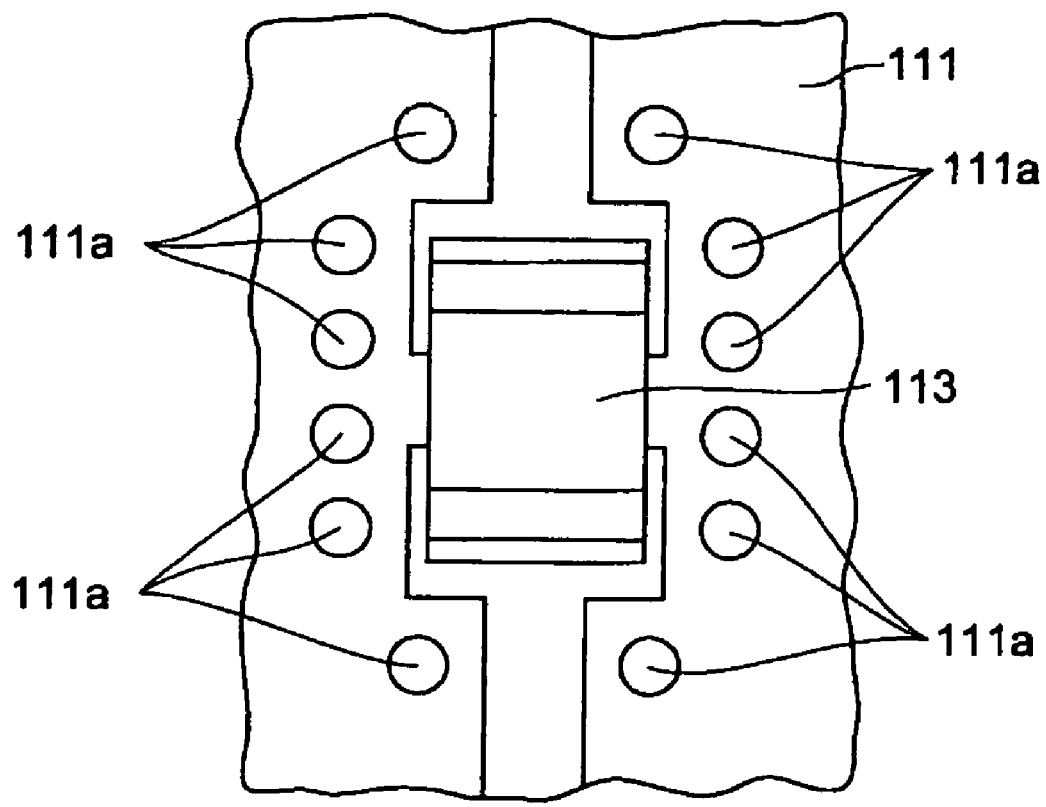
FIG. 3 is an enlarged view of an area around a capacitor shown in FIG. 1.

Next, the flexible substrate 111 will be described in detail. FIG. 3 is an enlarged view of an area around one of the capacitors 113 of the flexible substrate 111. As shown in FIG. 3, twelve holes 111a are formed around the capacitor 113. The holes 111a are provided such as to not affect the circuit configuration, and such as to surround the capacitor 113.

The twelve holes 111a thus surround a mounting region for mounting the capacitor 113. The holes 111a are formed such as to suppress propagation of vibration of the capacitor 113 to the outside, and thus form a vibration transmission suppressing region in the present invention.

Figure 4:
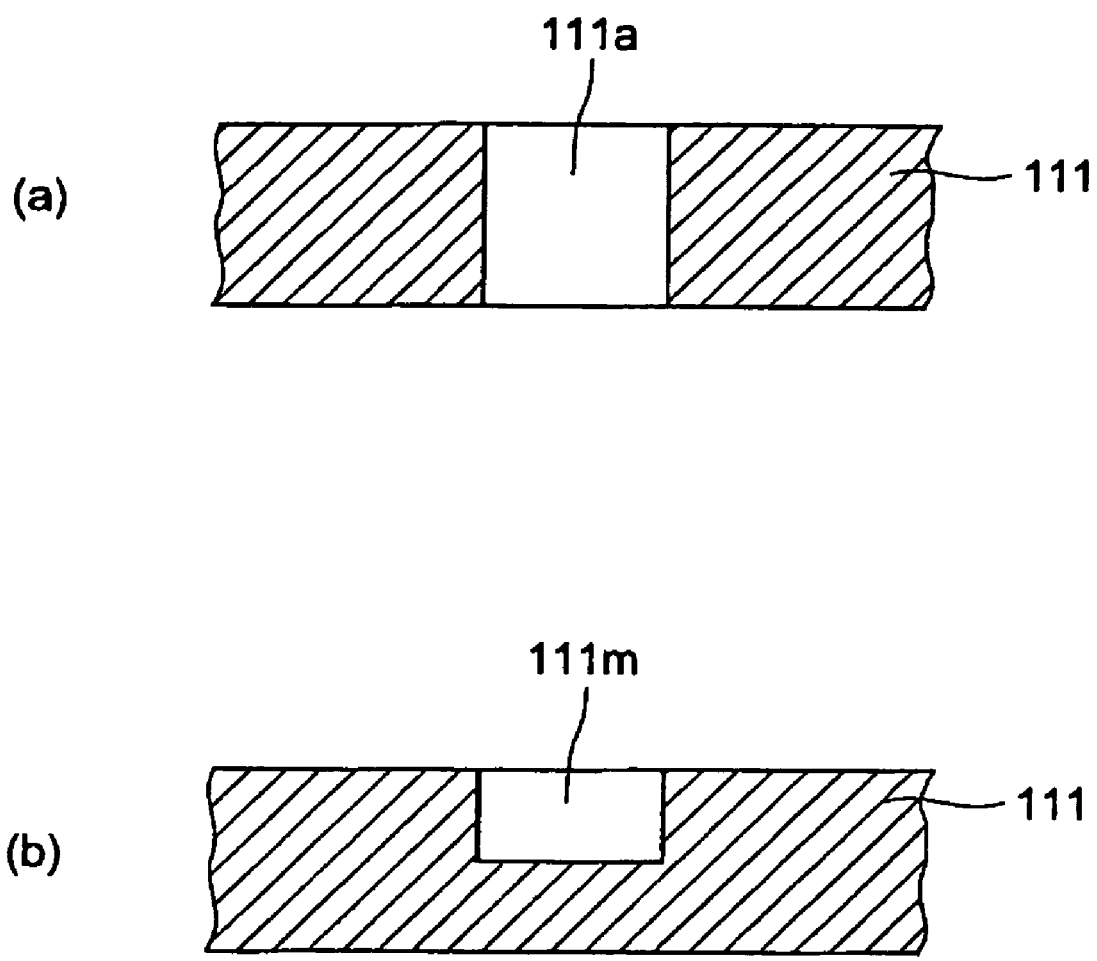
FIG. 4 are sectional views of FIG. 3, showing variations of FIG. 3.

As shown in FIG. 4A, each of the holes 111a is formed such as to penetrate through the flexible substrate 111. A portion where each hole 111a is formed thus becomes a discontinuous portion, whereby transmission of vibration of the capacitor 113 can be suppressed.

Each of the holes 111a may alternatively be formed as a recess 111m as shown in FIG. 4B. In this case, a portion where each recess 111m is formed does not become a discontinuous portion, but nevertheless the flexible substrate 111 becomes thinner at this portion, and hence transmission of vibration of the capacitor 113 can be suppressed.

Figure 5:
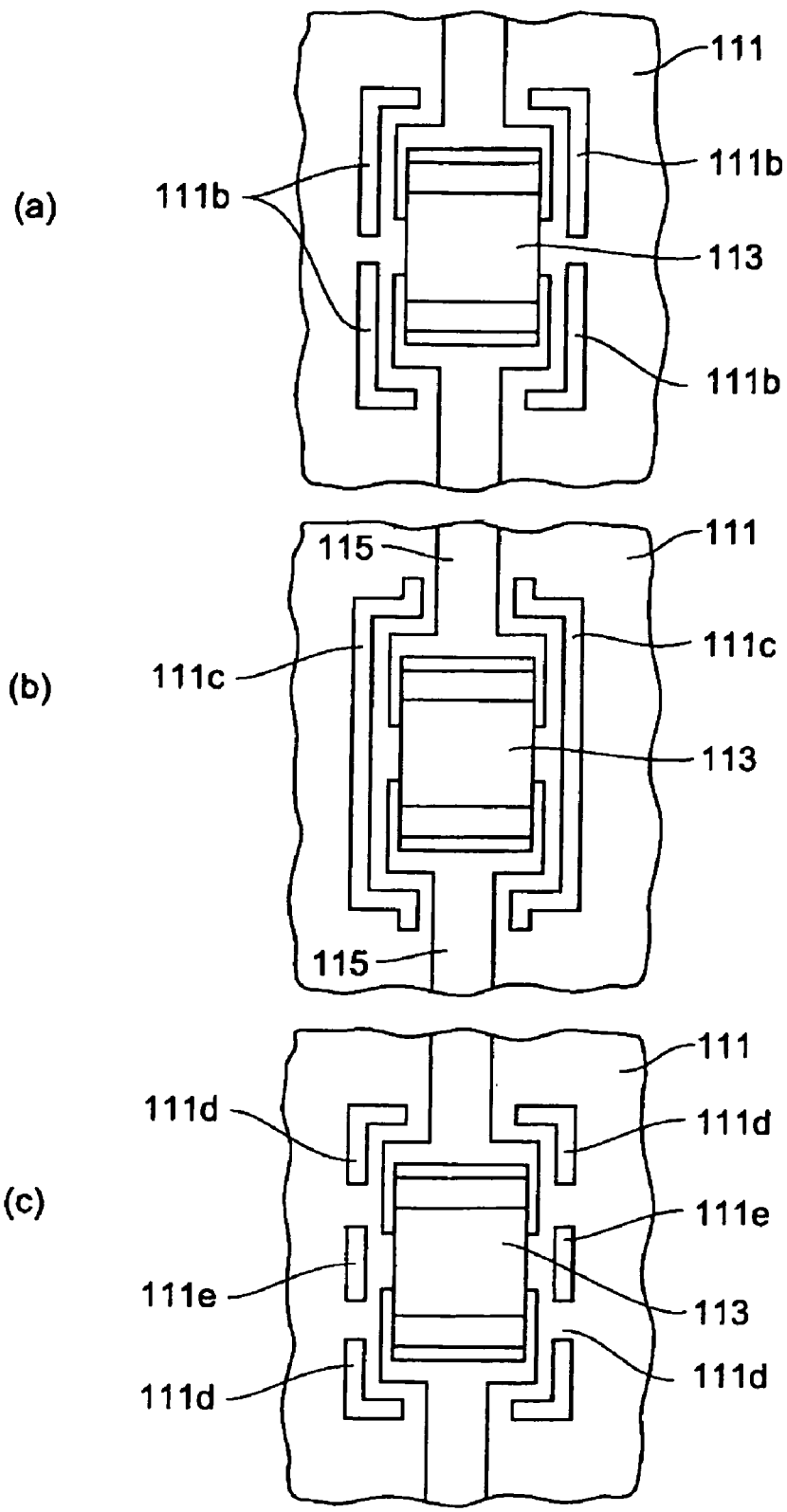
FIG. 5 are drawings showing variations of FIG. 3.

Moreover, rather than circular holes as with the holes 111a, slit-shaped holes may instead be formed as the vibration transmission suppressing region. Examples of this are shown in FIG. 5. In FIG. 5A, slits 111b are provided in four places such as to surround the capacitor 113. Each of the slits 111b is a slit having an L-shape that extends along sides of the capacitor 113 from a position corresponding to a corner of the capacitor 113.

Slits 111c shown in FIG. 5B are slits having a shape in which adjacent slits 111b in FIG. 5A are joined together, and moreover each end of each slit 111c is extended along wiring 115 to which the capacitor 113 is connected. Because the slits 111c are each formed so as to correspond to the whole of a long side of the capacitor 113, and moreover have a structure that in which a hole portion is extended along the wiring 115, transmission of vibration of the capacitor 113 can be suppressed more effectively.

FIG. 5C shows an example in which slits 111d and slits 111e are formed. The slits 111d are provided in four places around the corners of the capacitor 113. The slits 111e are provided in two places, each running along a long side of the capacitor 113 between adjacent slits 111d.

Figure 6:
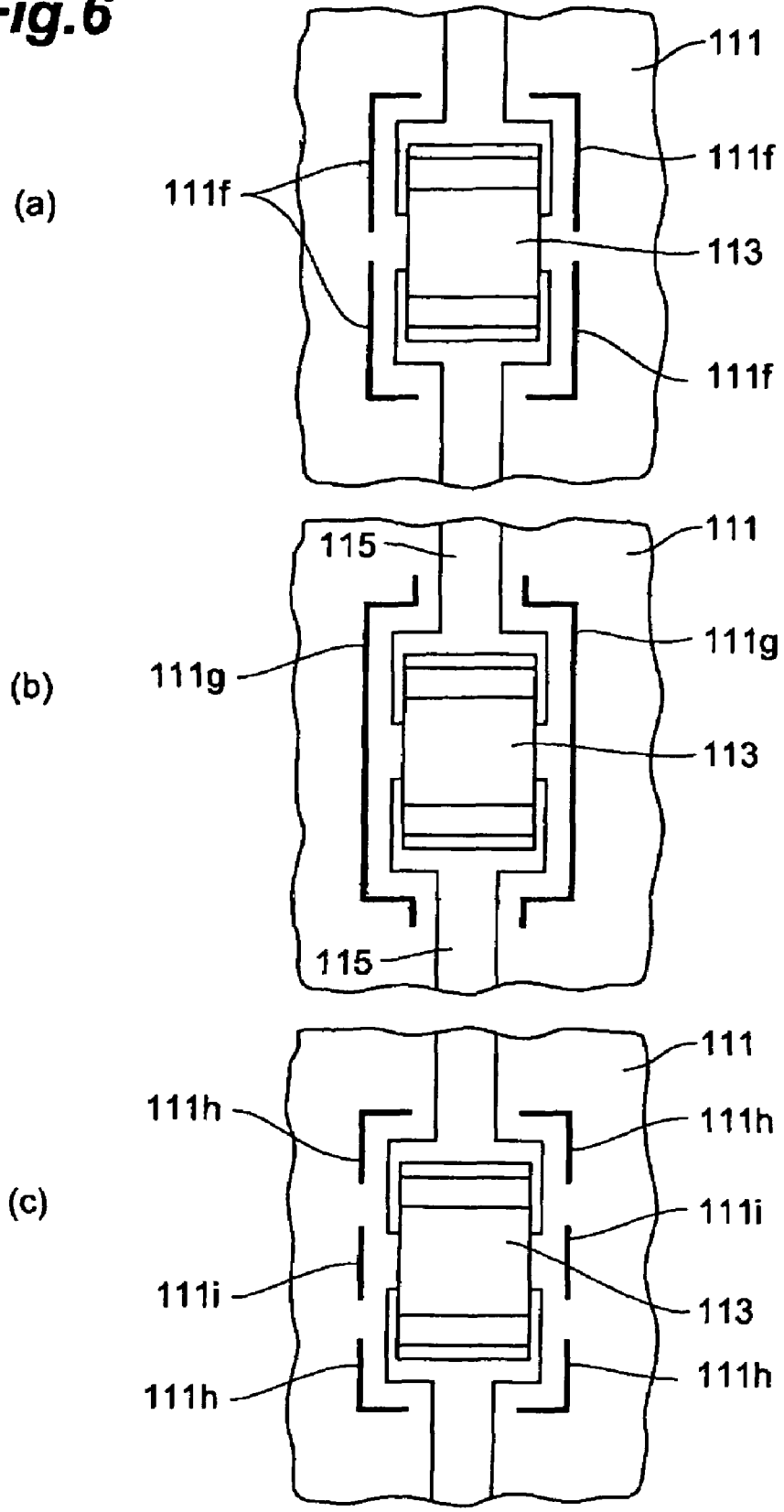
FIG. 6 are drawings showing variations of FIG. 3.

In FIG. 5, slit-shaped holes are provided as the vibration transmission suppressing region. However, rather than such wide holes, cuts may instead be provided as the vibration transmission suppressing region. FIG. 6 show examples in which cuts are provided as the vibration transmission suppressing region. FIG. 6A shows an example in which cuts 111f of the same shape as the slits 111b shown in FIG. 5A are provided in four places.

FIG. 6B shows an example in which cuts 111g of the same shape as the slits 111c shown in FIG. 5B are provided in two places. FIG. 6C is an example in which cuts 111h of the same shape as the slits 111d shown in FIG. 5C are provided in four places, and cuts 111i of the same shape as the slits 111e shown in FIG. 5C are provided in two places.

Figure 7:
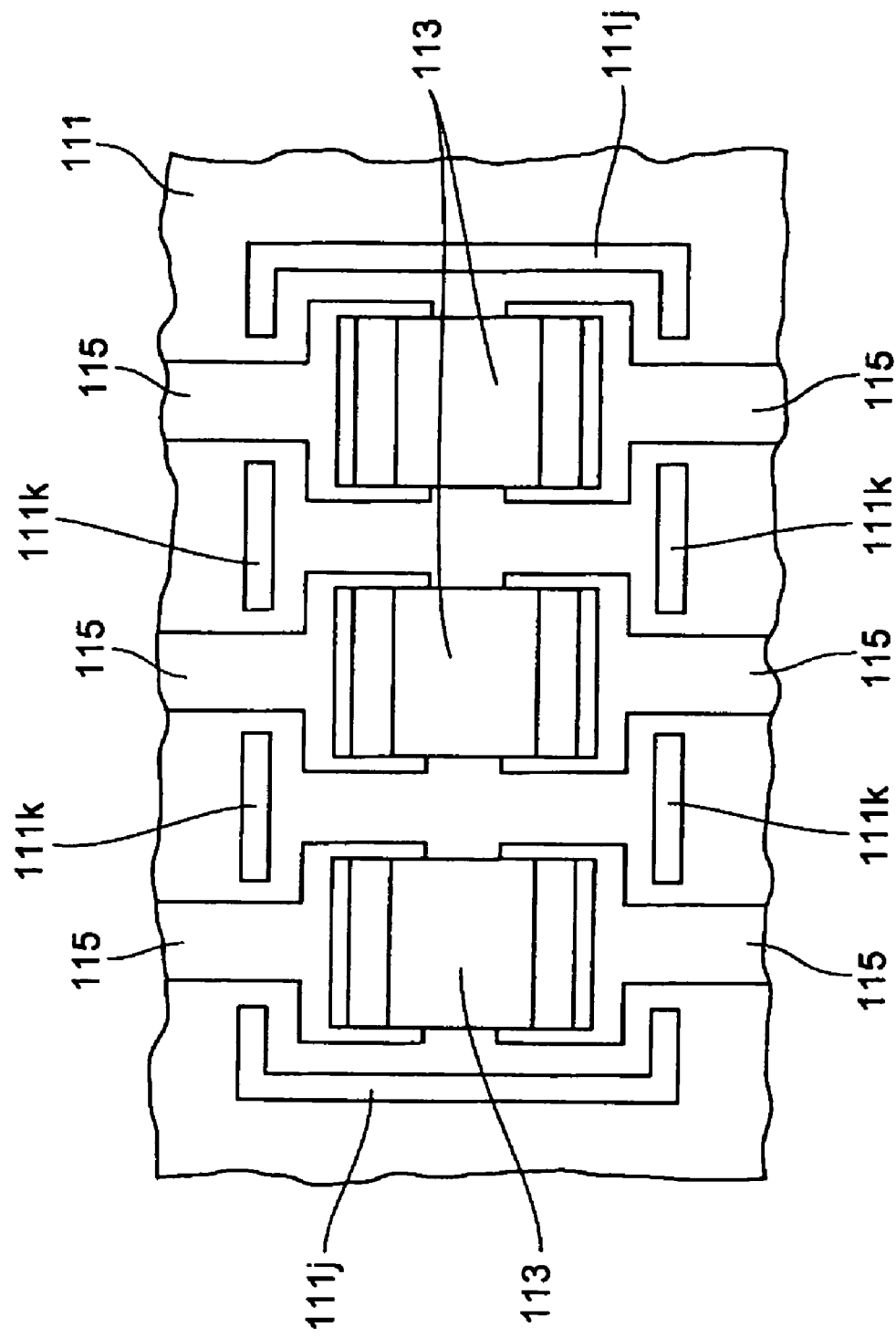
FIG. 7 is a drawing showing a variation of FIG. 3.

In the above examples, a vibration transmission suppressing region is formed for each individual capacitor 113, but a vibration transmission suppressing region may instead be formed such as to surround a group of a plurality of the capacitors 113. An example of this is shown in FIG. 7. In the example shown in FIG. 7, slits 111j and slits 111k are formed such as to surround three capacitors 113 arranged alongside one another.

More specifically, a pair of the slits 111j are provided, each of these slits 111i being formed along a long side of a capacitor 113 disposed outermost, and having each end thereof formed such as to go around a corner of that capacitor 113. The slits 111k are provided in four places such as to run along short sides of the capacitors 113, each of the slits 111k being between wiring 115 to which is connected a capacitor 113 disposed outermost and wiring 115 to which is connected a capacitor 113 on the inside. If a vibration transmission suppressing region is formed through the slits 111j and the slits 111k in this way, then it can be made to be such that slits are not provided between all of the capacitors 113, and hence the spatial efficiency can be improved.

According to the embodiments described above, holes 111a (recesses 111m, slits 111b to 111e, 111j to 111k, cuts 111f to 111i) are formed as a vibration transmission suppressing region surrounding a mounting region in which is mounted a capacitor 113 (layered component). As a result, propagation of vibration caused by the capacitor 113 to other regions can be suppressed effectively. Noise due to the capacitor 113 can thus be reduced effectively without depending on changing the capacitor 113 itself or the mounting position of the capacitor 113.

More specifically, due to piezoelectric properties of the capacitor 113 (layered component), upon an AC voltage being applied, mechanical stain is produced in the capacitor 113 in synchronization with the AC voltage. This mechanical stain is transmitted to the flexible substrate 111 which thus vibrates. If holes 111a (recesses 111m, slits 111b to 111e, 111j to 111k, cuts 111f to 111i) as in the embodiments described above are not provided as a vibration transmission suppressing region then this vibration propagates to the whole of the flexible substrate 111, and if the period of vibration is an audible frequency, then the flexible substrate 111 produces noise as an acoustic emission surface. This noise should be eliminated in particular in the case of a music player 2 or a mobile phone 3. The holes 111a (recesses 111m, slits 111b to 111e, 111j to 111k, cuts 111f to 111i) are thus provided as a vibration transmission suppressing region, whereby propagation of vibration to the whole of the flexible substrate 111 is suppressed, and hence noise can be effectively suppressed from arising.

What is claimed is:

1. A mounted structure obtained by mounting a layered component on a flexible substrate for mounting said layered component, wherein
    said layered component is a multilayer capacitor having piezoelectric properties and deforms in a direction of an electric field applied to the multilayer capacitor,
    said flexible substrate has flexibility, and has thereon a mounting region for mounting said layered component, and a vibration transmission suppressing region formed so as to surround said mounting region,
    said vibration transmission suppressing region is formed from holes, cuts, or recesses which are formed in discontinuous portions along a circumferential direction surrounding the mounting region,
    said flexible substrate has wirings arranged thereon, the wirings extending along a discontinuous portion of the holes, cuts, or recesses, and
    said layered component is mounted in said mounting region, and said layered component is connected to the wirings.

2. The mounted structure according to claim 1, wherein a plurality of said layered components are mounted close to one another in a group, and said vibration transmission suppressing region is formed so as to surround said group of said layered components.

3. The mounted structure according to claim 1, wherein the multilayer capacitor has substantively rectangular shape in planar view,
    the holes, cuts, or recesses are formed along a long side direction and a short side direction of the multilayer capacitor.

4. A display unit comprising a display panel and a flexible substrate electrically connected to said display panel, wherein
    said flexible substrate has flexibility and is a substrate for mounting a layered component,
    said layered component is a multilayer capacitor having piezoelectric properties and deforms in a direction of an electric field applied to the multilayer capacitor,
    said flexible substrate has thereon a mounting region for mounting said layered component, and a vibration transmission suppressing region formed so as to surround said mounting region,
    said vibration transmission suppressing region is formed from holes, cuts, or recesses which are formed in discontinuous portions along a circumferential direction surrounding the mounting region,
    said flexible substrate has wirings arranged thereon, the wirings extending along a discontinuous portion of the holes, cuts, or recesses, and
    said layered component is mounted in said mounting region, and said layered component is connected to the wirings.

5. The display unit according to claim 4, wherein
    the multilayer capacitor has substantively rectangular shape in planar view,
    the holes, cuts, or recesses are formed along a long side direction and a short side direction of the multilayer capacitor.

6. A portable electronic apparatus having a display unit comprising a display panel and a flexible substrate electrically connected to said display panel, wherein
    said flexible substrate has flexibility and is a substrate for mounting a layered component,
    said layered component is a multilayer capacitor having piezoelectric properties and deforms in a direction of an electric filed applied to the multilayer capacitor,
    said flexible substrate has thereon a mounting region for mounting said layered component, and a vibration transmission suppressing region formed so as to surround said mounting region,
    said vibration transmission suppressing region is formed from holes, cuts, or recesses which are formed in discontinuous portions along a circumferential direction surrounding the mounting region,
    said flexible substrate has wirings arranged thereon, the wirings extending along a discontinuous portion of the holes, cuts, or recesses, and
    said layered component is mounted in said mounting region, and said layered component is connected to the wirings.

7. The portable electronic apparatus according to claim 6, wherein
    the multilayer capacitor has substantively rectangular shape in planar view,
    the holes, cuts, or recesses are formed along a long side direction and a short side direction of the multilayer capacitor.

* * * * *